United States Patent [19]
Cole et al.

[11] Patent Number: 4,960,613
[45] Date of Patent: Oct. 2, 1990

[54] LASER INTERCONNECT PROCESS

[75] Inventors: Herbert S. Cole, Scotia; Yung S. Liu, Schenectady, both of N.Y.

[73] Assignee: General Electric Company, Schenectady, N.Y.

[21] Appl. No.: 253,020

[22] Filed: Oct. 4, 1988

[51] Int. Cl.$^5$ .................. B05D 3/06; B05D 5/12; B05D 3/02

[52] U.S. Cl. .................. 427/53.1; 427/96; 427/97; 427/229; 427/123

[58] Field of Search .......... 427/53.1, 229, 304, 427/305, 306, 97, 96, 98, 99, 123, 252, 253

[56] References Cited

U.S. PATENT DOCUMENTS

| | | | |
|---|---|---|---|
| 3,772,056 | 11/1973 | Polichette et al. | 427/53.1 |
| 4,169,171 | 9/1979 | Narcus | 427/304 |
| 4,332,879 | 6/1982 | Pastor et al. | 427/229 |
| 4,340,617 | 7/1982 | Duetsch et al. | 427/53.1 |
| 4,388,517 | 6/1983 | Schulte et al. | 219/121 |
| 4,511,597 | 4/1985 | Teng et al. | 427/53.1 |
| 4,543,270 | 9/1985 | Oprysko et al. | 427/53.1 |
| 4,574,095 | 3/1986 | Baum et al. | 427/53.1 |
| 4,592,975 | 6/1986 | Young et al. | 430/5 |
| 4,606,932 | 8/1986 | Oprysko et al. | 427/53.1 |
| 4,727,234 | 2/1988 | Oprysko et al. | 219/121 L |
| 4,830,880 | 5/1989 | Okubi et al. | 427/229 |
| 4,840,820 | 6/1989 | Schultz et al. | 427/305 |
| 4,865,873 | 9/1989 | Cole, Jr. et al. | 427/304 |
| 4,869,930 | 9/1989 | Clark et al. | 427/304 |
| 4,900,581 | 2/1990 | Stuke et al. | 427/53.1 |

OTHER PUBLICATIONS

Cole, H. S. et al., "Laser Processing for Interconnect Technology", SPIE, vol. 877, Micro-Optoelectronic Materials (1988), pp. 92-96.

Cole, H. S. et al., "Laser-Induced Selective Copper Deposition on Polyimide", Applied Physics Letters, 53(21), Nov. 21, 1988, pp. 2111-2113.

*Primary Examiner*—Shrive Beck
*Assistant Examiner*—Marianne Padgett
*Attorney, Agent, or Firm*—Robert Ochis; James C. Davis, Jr.; Marvin Snyder

[57] ABSTRACT

The uniformity of a catalyst layer produced by laser decomposition of a catalyst source compound is substantially improved for patterned substrates whose characteristics vary along the path of a conductor line by providing a buffer layer of a metal such as Ti, Cr or Ni over the substrate prior to the laser induced decomposition of the catalyst source compound.

18 Claims, 7 Drawing Sheets

LASER INTERCONNECT PROCESS

BACKGROUND OF THE INVENTION

1. Field of the Invention

The present invention relates to the field of forming conductor patterns, and more particularly, to forming conductors on substrates in patterns which are determined by laser illumination.

2. Prior Art

It is known from U.S. Pat. No. 4,340,617 to form a conductor pattern on a substrate via laser induced photodecomposition of a gaseous source material to deposit metal on the substrate in a pattern which corresponds to the pattern of the laser illumination. It is also known from U.S. Pat. No. 4,574,095 to use the technique of U.S. Pat. No. 4,340,617 to deposit a palladium metal activator on a substrate in the pattern of the laser illumination and then to selectively electrolessly plate copper on the activated portion of the substrate by immersing the substrate in an electroless copper plating bath. Both of these patents are incorporated herein by reference.

U.S. Pat. Nos. 4,340,617 and 4,574,095 both employ a laser which is focused adjacent to (not on the surface of) the substrate and depend on absorption of the laser light by the gaseous source material rather than the substrate. Both of these patents discuss their deposition process in a manner which makes no distinction between uniform substrates and substrates whose characteristics vary with position. Since both of these processes depend on decomposition of a gaseous material, both require that the deposition process be carried out in an enclosed container having a carefully controlled atmosphere. In a production environment, this limits system throughput and has attendant disadvantages.

U.S. Pat. No. 4,574,095 discloses use of its process with a substrate having a polymer layer thereon and touts as an advantage the fact that the laser beam causes removal of the polymer layer in the irradiated area and palladium metal deposition takes place in the same location. Upon electrolessly plating copper on that substrate, the copper conductor formed on the palladium is imbedded in the polymer and level therewith whereby the conductor is protected from mechanical damage. Thus, U.S. Pat. No. 4,574,095 teaches its process is not usable for forming a conductor pattern on top of a polymer layer since the process of catalyst deposition removes the polymer layer from the substrate. However, the removal of the polymer layer in the irradiated area is a disabling disadvantage where it is desired to form the conductor pattern on top of the polymer layer.

An article entitled "Laser Processing for Interconnect Technology" by H. S. Cole, Y. S. Liu, R. Guida and J. Rose which appears at SPIE Vol. 877, Micro-Optoelectronic Materials (1988), pages 92-96, of which the first two coauthors are the present inventors, describes a metal deposition process in which a solid source compound such as palladium acetylacetonate (PdAcAc) or palladium acetate (PdAc) is disposed on a substrate surface and laser decomposed to provide a palladium catalyst for electroless deposition of copper.

We have found that substantial problems which are not addressed in the above two patents and for which no solutions are disclosed in those patents are present when laser induced decomposition is applied to a substrate which has substantial non-uniformities in optical and thermal properties. An example of particularly severe changes in properties is a structure in which a polymer layer is disposed over a substrate and has via holes therein disposed in alignment with a metal layer on the substrate and it is desired to form a conductor pattern which is disposed on top of the polymer layer and which extends down into via holes and onto the metal which is exposed at the bottom of the via holes. The polymer layer and the metal layer at the bottom of a via hole have substantially different optical reflectivities, optical absorptivities and thermal conductivities. As a result of these substantial differences in characteristics, a laser beam scan rate which is effective on top of the polymer layer is ineffective at the bottom of the via hole. We have also found that an increase in power density or a reduction in the scan rate on the metal layer at the bottom of the via hole which is sufficient to cause catalyst source material decomposition on that metal is destructive to the directly adjacent portions of the polymer layer.

A process which will reliably and uniformly deposit a metallization pattern both on the top surface of a polymer film and on the walls of via holes in that film and on metallization exposed at the bottom of those via holes is needed.

OBJECTS OF THE INVENTION

Accordingly, a primary object of the present invention is to provide a method of forming a conductor pattern on a substrate whose surface is comprised of areas having differing characteristics.

Another object of the invention is to enable a uniform set of writing conditions to be used to form a conductor pattern on different portions of the surface of a patterned substrate whose different portions have substantially different characteristics.

A further object of the invention is to provide a method of forming a conductor pattern on a substrate whose surface is comprised of a polymer layer having via holes therein at the bottom of which a metal layer is exposed.

SUMMARY OF THE INVENTION

In accordance with the present invention, the above and other objects are accomplished by a patterned conductor formation process comprising: (1) forming a buffer layer on the surface of a patterned substrate on which the conductor pattern is to be formed, (2) laser decomposing a catalyst source compound to provide a catalyst pattern on the buffer layer in the desired pattern of the final conductor and (3) electrolessly depositing a conductor layer on the buffer layer in a pattern determined by the catalyst pattern. Thereafter, the portion of the buffer layer which is not covered by the conductor layer may be removed by selective etching. The catalyst may be deposited by decomposition of a gas or liquid phase catalyst source material or a solid phase catalyst source compound may be disposed on the surface of the buffer layer and decomposed in situ by the laser beam.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

While the patents referred to above provide the ability to deposit conductor patterns using gaseous source materials, substantial problems arise when it is desired to form a conductor pattern on a substrate having a non-uniform composition and associated characteristics which vary greatly. One situation in which such a pattern is desired is in a high density interconnect system in which a polymer overlayer is formed on a substrate and via holes are provided in the polymer layer in alignment with conductors which are exposed at the surface of that substrate. Such a high density interconnect system is described in a number of patents and patent applications which are assigned to the same assignee and are incorporated herein by reference: U.S. Pat. No. 4,714,516, issued Dec. 22, 1987 and entitled "Method to Produce Via Holes in Polymer Dielectrics for Multiple Electronic Circuit Chip Packaging" by Charles W. Eichelberger and Robert J. Wojnarowski; U.S. patent application Ser. No. 912,456, filed Sept. 26, 1986, now U.S. Pat. No. 4,783,695 entitled "Multichip Integrated Circuit Packaging Configuration and Method" by Charles W. Eichelberger and Robert J. Wojnarowski and Kenneth B. Welles, II; U.S. patent application Ser. No. 912,457, filed Sept. 26, 1986, now U.S. Pat. No. 4,866,508 entitled "Integrated Circuit Packaging Configuration for Rapid Customized Design and Unique Test Capability" by Charles W. Eichelberger, Kenneth B. Welles, II, and Robert J. Wojnarowski; U.S. patent application Ser. No. 240,367, filed Aug. 30, 1988, now U.S. Pat. No. 4,933,042 as a continuation of application Ser. No. 912,458, filed Sept. 26, 1986, now abandoned entitled "Method and Apparatus for Packaging Integrated Circuit Chips Employing a Polymer Film Overlay Layer" by Charles W. Eichelberger, Robert J. Wojnarowski and Kenneth B. Welles, II; U.S. patent application Ser. No. 230,654, Aug. 5, 1988, now U.S. Pat. No. 4,884,122 as a continuation of U.S. patent application Ser. No. 912,454, filed Sept. 26, 1986, now abandoned entitled "Method and Configuration for Testing Electronic Circuits and Integrated Circuit Chips Using a Removable Overlay Layer" by Charles W. Eichelberger, Robert J. Wojnarowski and Kenneth B. Welles, II, now U.S. Pat. No. 4,884,122; and U.S. patent application Ser. No. 947,461, filed Dec. 29, 1986 now U.S. Pat. No. 4,835,704 entitled "An Adaptive Lithography System to Provide High Density Interconnect" by Charles W. Eichelberger, Robert J. Wojnarowski and Kenneth B. Welles, II.

The subject high density interconnect system is also described in an article entitled "High-Density Interconnects for Electronic Packaging" by C. W. Eichelberger, R. J. Wojnarowski, R. O. Carlson and L. M. Levinson which appeared at SPIE Vol. 877 Micro-Optoelectronic Materials, pages 90–91, (1988). Laser controlled metal patterning is also described in the above-mentioned article entitled "Laser Processing for Interconnect Technology" by H. S. Cole et al. Each of these patents, patent applications and articles is incorporated herein by reference.

As discussed above, U.S. Pat. No. 4,574,095 teaches that use of its process with such a substrate results in removal of the polymer layer in the irradiated area. Such polymer removal is unacceptable in a high density interconnect system where the polymer layer serves as the interlayer dielectric.

The characteristics of the substrate surface in such a high density interconnect system change abruptly at the bottom of a via hole for a conductor pattern which involves a conductor line extending along the polymer surface and into a via hole into contact with an underlying metal conductor. This is because the conductor at the bottom of the via hole has an optical reflectivity, an optical absorptivity and a thermal conductivity which are very different from those of the polymer layer. In particular, the reflectivity of the metal layer at the bottom of the via hole is normally much greater than that of the polymer layer for the laser beam which is used to decompose the catalyst source compound. The polymer layer typically has a substantially greater absorptivity for the laser beam (normally in the ultraviolet portion of the spectrum) than does the metal layer at the bottom of the via hole. Finally, the thermal conductivity of the metal at the bottom of the via hole is normally substantially greater than that of the polymer layer. Thus, the metal layer at the bottom of the via hole conducts heat away from the laser illuminated spot much more rapidly than the polymer layer does. These differences result in a failure to decompose catalyst source material on the metal at the bottom of a via hole when the exposure process is adjusted to provide good quality catalyst on the polymer layer portion of the substrate. This results in either poor quality metallization or an absence of metallization in the via hole. The problem of lack of source material decomposition in the via hole may be overcome by slowing down the laser scan rate (or increasing laser power) as a via hole is reached in order to increase the laser energy density at the bottom of the via hole to compensate for the differences in material characteristics such as absorption of the laser beam and conduction away of the heat its absorption produces. However, when sufficient power is applied at the bottom of a via hole to cause the required deposition of catalyst metal on the underlying metal layer, the adjacent portion of the overlying polymer layer (in which the via hole is disposed) can be damaged or destroyed with the result that a reliable, high quality conductor pattern cannot be produced which extends along the polymer surface and into the via hole and into reliable electrical contact with the underlying metal layer. The problem of polymer damage or destruction is a result of the relatively low thermal capacity of the polymer and the fact that even those polymers which are stable at high temperatures are much more sensitive to heat than prior art substrates such as silicon semiconductor chips and glass.

The present invention overcomes these problems and provides a method of conductor pattern formation in which the scan rate and power level of the laser can remain substantially constant independent of whether the area being exposed is on top of the polymer dielectric layer or at the bottom of a via hole where an underlying conductor is exposed.

Figures 1, 2:
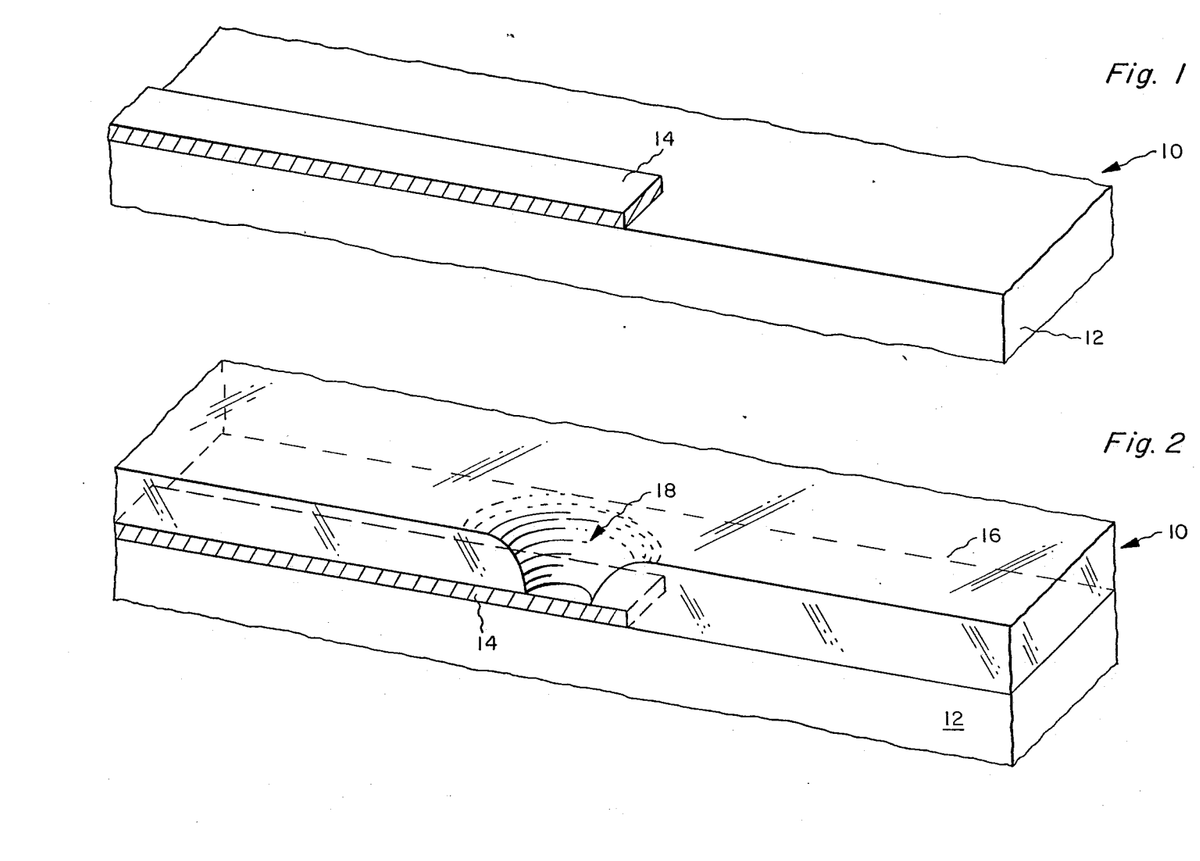
FIGS. 1–8 are perspective views of a workpiece undergoing the steps of one embodiment of the present invention.

In FIG. 1, a workpiece 10 is shown in a perspective view. The workpiece 10 comprises a substrate 12 having a conductor line 14 disposed on the upper surface thereof. Normally the substrate will have many conductor lines or contact pads thereon. The conductor line 14 is a representative of those conductors. This substrate may be an electrical device such as an integrated circuit, a dielectric layer such as is present in a partially fabricated multilevel high density interconnect structure or any other desirable substrate. Internal details of the substrate's structure are not shown since they normally do not affect the process of the present invention.

In FIG. 2, a polymer layer 16 has been formed on or laminated to the upper surface of the substrate 12 and the conductor line 14. This polymer layer is preferably a polyimide and may be a polyetherimide such as the Ultem ® polyetherimide resins sold by General Electric Company. Other polymers such as polyimide-siloxances, polysulfones, epoxys, polycarbonates, polyesters, polyester-imides, and the like can be incorporated as the polymer layer. Thermoplastic and thermospset polymers can be utilized. A via hole 18 has been formed in the dielectric or polymer layer 16 in alignment with the conductor line 14. Conductor line 14 is exposed at the bottom of the via hole in order to provide a conductive connection between conductor 14 and the conductor pattern which is to be formed on the upper surface of the polymer layer 16. Normally, many via holes are formed in the polymer layer in order to make contact to many of the conductor lines or contact pads on the substrate's surface.

Figure 3:
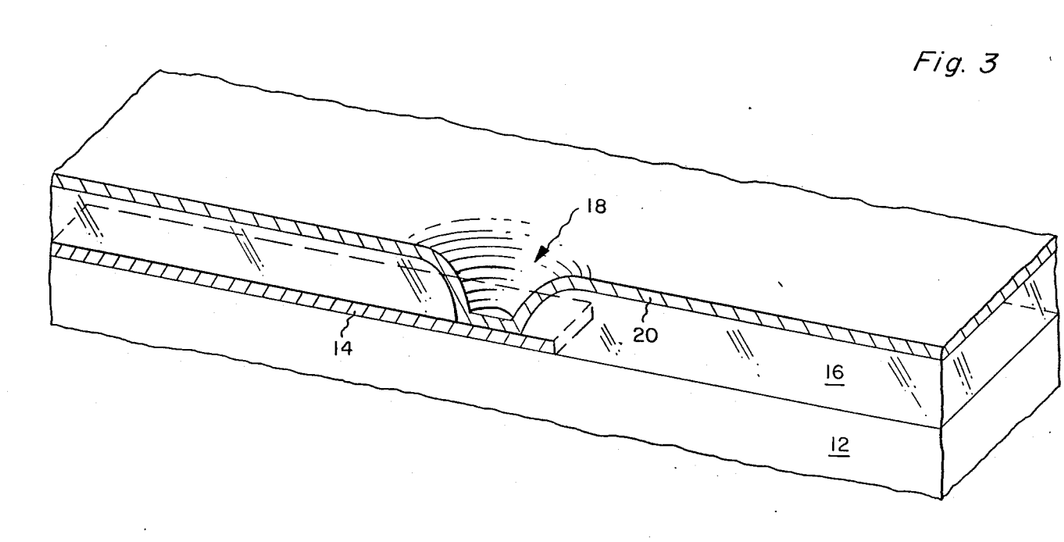

In FIG. 3, a buffer layer 20 of metal which may preferably be titanium (Ti) or chromium (Cr), has been deposited on the entire upper surface of the workpiece 10 including the polymer layer 16 and (at the bottom of the via hole 18) the conductor line 14. This buffer layer may preferably be applied to the substrate by sputter deposition and may preferably have a thickness in the vicinity of 500 angstroms to 1000 angstroms, but may be thinner or thicker and may be formed by other processes, if desired. The buffer layer 20 is preferably a conductor in those situations where a low resistance electrical connection is needed between the conductor 14 and the conductor pattern to be formed on the polymer layer 16. However, if such a connection is not required, other buffer materials may be used. The buffer material should be compatible with the polymer layer 16, the conductor 14 and the conductor system which will be formed on the workpiece 10. In order that the final conductor pattern will be well adhered to the workpiece 10, it is desirable that the buffer material be one which adheres well to both the polymer layer 16 and the metal of the conductor 14. Further, it is desirable that the buffer material be one which provides good adherence for the conductor pattern which is to be formed on the workpiece 10. Both titanium (Ti) and chromium (Cr) satisfy these criteria.

Figure 4:
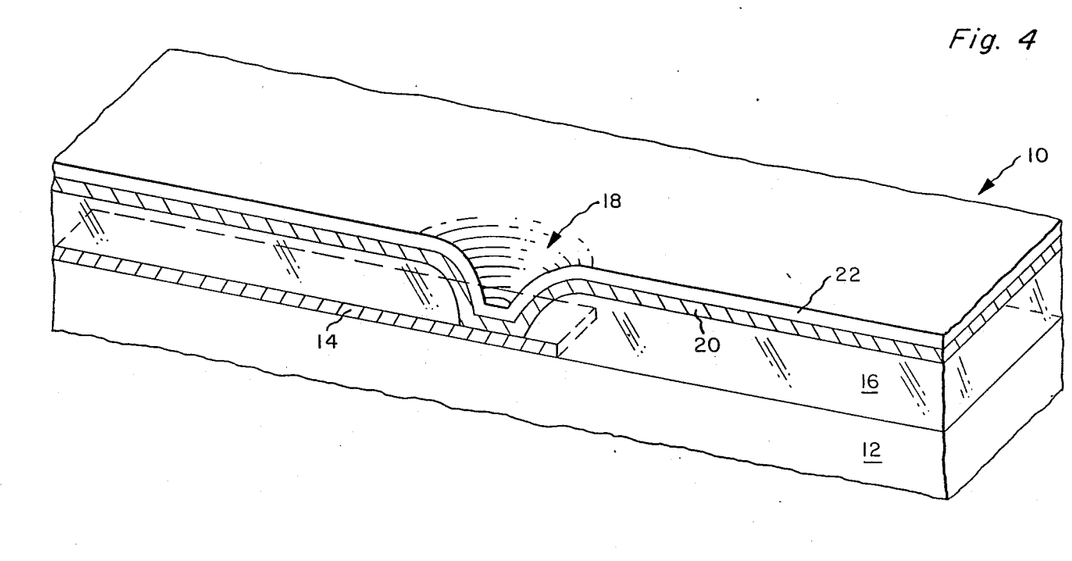

In FIG. 4, a layer 22 of a catalyst source compound has been deposited over the entire upper surface of the buffer layer 20. The catalyst source compound may preferably be palladium acetate (PdAc), but may be other palladium compounds or source compounds for other catalysts may be substituted if desired. A palladium acetate layer is preferably formed on the workpiece 10 by spin coating the surface of the workpiece with a solution of palladium acetate dissolved in chloroform. An alternative palladium source compound is palladium acetylacetonate (PdAcAc). A gaseous or liquid catalyst source compound may also be used under proper conditions, see for example, U.S. Pat. Nos. 4,340,617 and 4,574,095. An appropriate gaseous source compound for palladium catalysts is palladium hexofluoroacetylacetonate (PdHFAcAc). Other gaseous or liquid compounds may be used as desired. The workpiece 10 shown in FIG. 4 is then exposed to a laser beam of sufficient intensity to cause decomposition of the catalyst source compound (PdAc in this situation) into elemental palladium and decomposition products. This exposure of the palladium acetate to the laser is done in a pattern 26 which corresponds to the desired metallization pattern to be formed on the workpiece 10. At the completion of this illuminating step, a layer 24 (shown in FIG. 5) of elemental palladium is disposed on and firmly adhered to the buffer layer 20 in the pattern of the laser illumination. The layer 24 of palladium may be a continuous layer or a dense scattering of individual palladium atoms. The important consideration is that the palladium be distributed with sufficient density to enable it to catalyze the subsequent electroless deposition of a uniform continuous metal layer on workpiece 10 in the pattern of the laser illumination.

The use of the solid source material for the palladium catalyst provides a number of advantages in a process of this type. First, the source material is easily coated on the substrate as by spin coating. Second, the laser exposure can be done in an air atmosphere. Consequently, there is no need for a controlled atmosphere or vacuum chamber for deposition of the catalyst material such as is required by the processes disclosed in U.S. Pat. Nos. 4,340,617 and 4,574,095. This reduces the capital investment required to perform the process, simplifies process control and can substantially increase process throughput by avoiding the need for evacuating a chamber in order to purge it of undesired gases and provide it with a desired controlled quantity of source gases. For these reasons, use of a solid catalyst source material is considered preferable to the use of gaseous source materials as in U.S. Pat. Nos. 4,340,617 and 4,574,095. However, gaseous or liquid phase catalyst source materials may be used if desired.

Figure 5:
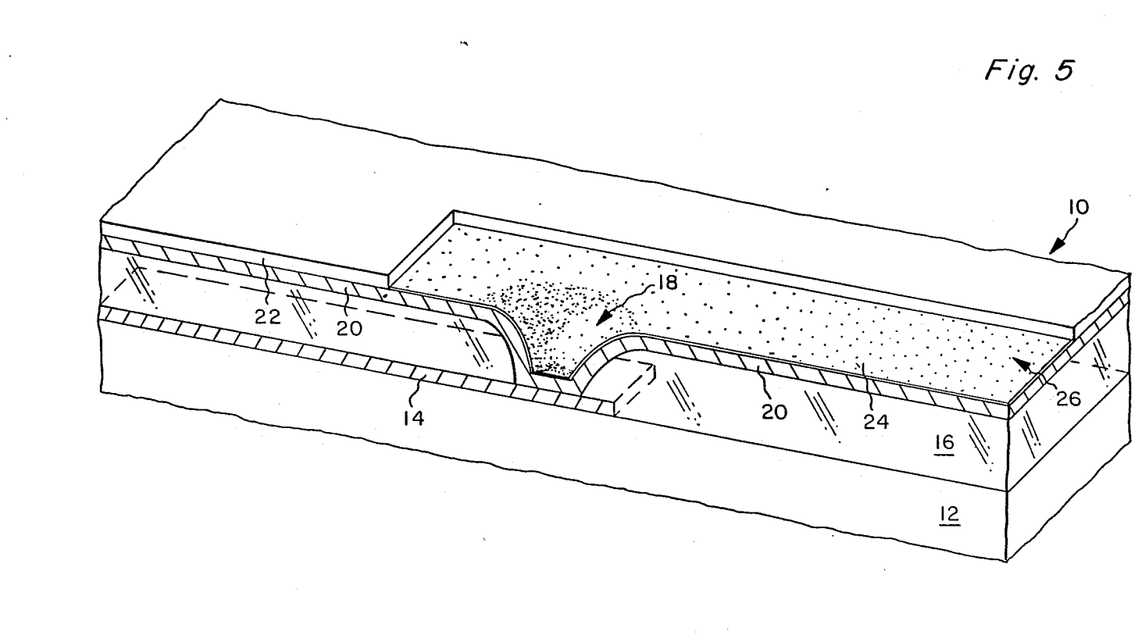
Figure 6:
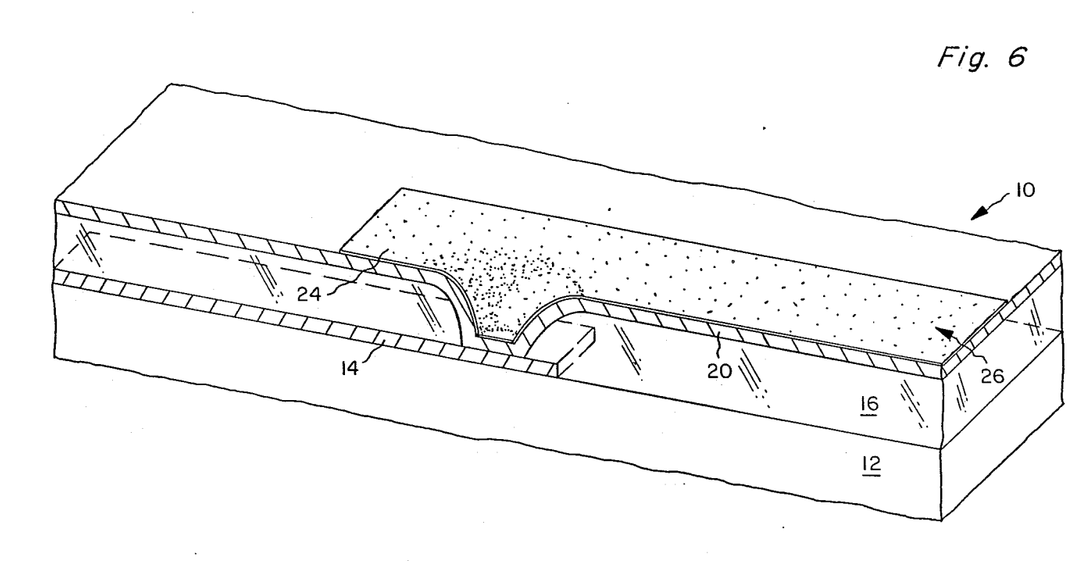

Workpiece 10 is shown in FIG. 5 after the palladium acetate layer has been locally exposed to the laser beam. The pattern 26 normally comprises elemental palladium and decomposition products and/or some undecomposed source material. This selective laser illumination preferably employs scanning of the laser beam in the desired conductor pattern, but may involve a mask if desired. The power of the laser beam and the rate at which the laser beam is swept across the workpiece 10 are selected in a manner to cause sufficient decomposition of the catalyst source compound everywhere along the center of the scanned path to provide a sufficient density of palladium to provide a continuous, high quality electroless metal layer in the subsequent electroless plating step. The laser exposure provides a layer of catalyst metal (Pd in the case of a PdAc source compound) everywhere along the laser scan path. After completion of the tracing or scanning of the laser scan path 26, the workpiece 10 is rinsed in an appropriate solvent (such as chloroform for palladium acetate) to remove the unreacted or undecomposed catalyst source compound from the workpiece 10 and any organic decomposition products present in the exposed area of pattern 26, all without disturbing the metal catalyst which is disposed on the upper surface of the buffer layer where the catalyst source layer was exposed to the laser. The workpiece 10 is shown in FIG. 6 after removal of the unreacted catalyst source compound.

Figure 7:
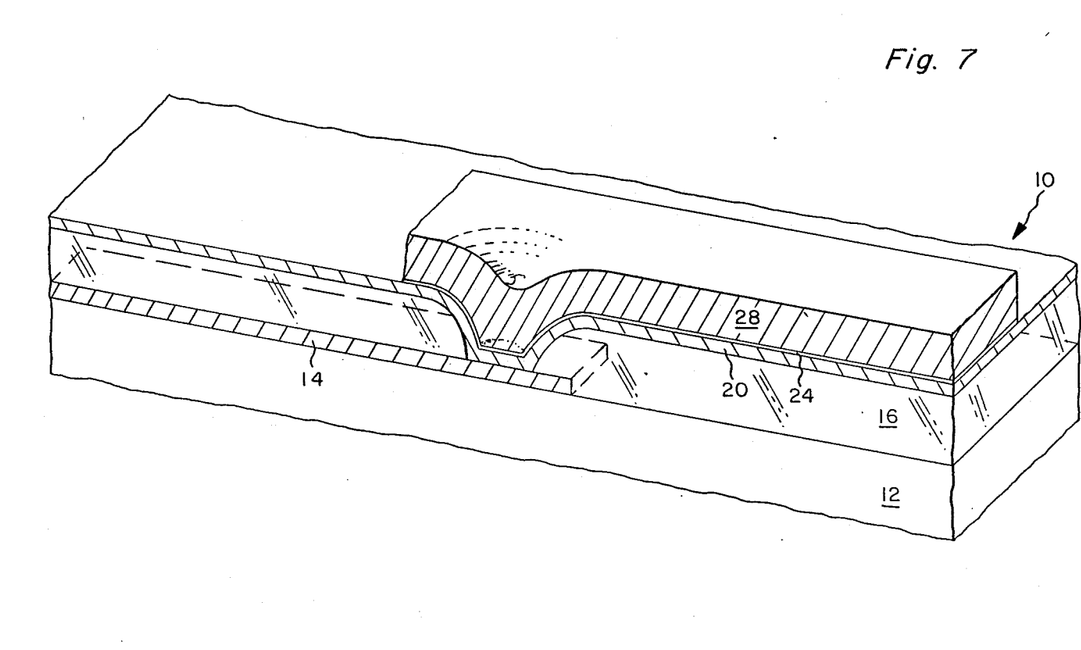

The workpiece 10 is then immersed in an electroless plating bath to deposit a conductor layer 28 on the upper surface of the workpiece 10, in the pattern 26 as traced by the laser, i.e. where the palladium metal catalyst is present on the surface of the workpiece 10. The workpiece 10 is shown in FIG. 7 after completion of the electroless plating step. The electrolessly plated metal 28 may be any appropriate metal for the particular composition of the workpiece 10 and its intended use. Appropriate metals which may be electrolessly deposited in this manner include copper (Cu), tin (Sn), nickel (Ni) and gold (Au), but are not limited thereto. It is understood that plating metals other than copper may require other catalysts and thus other source materials or may allow use of other catalysts and catalyst source materials.

Figure 8:
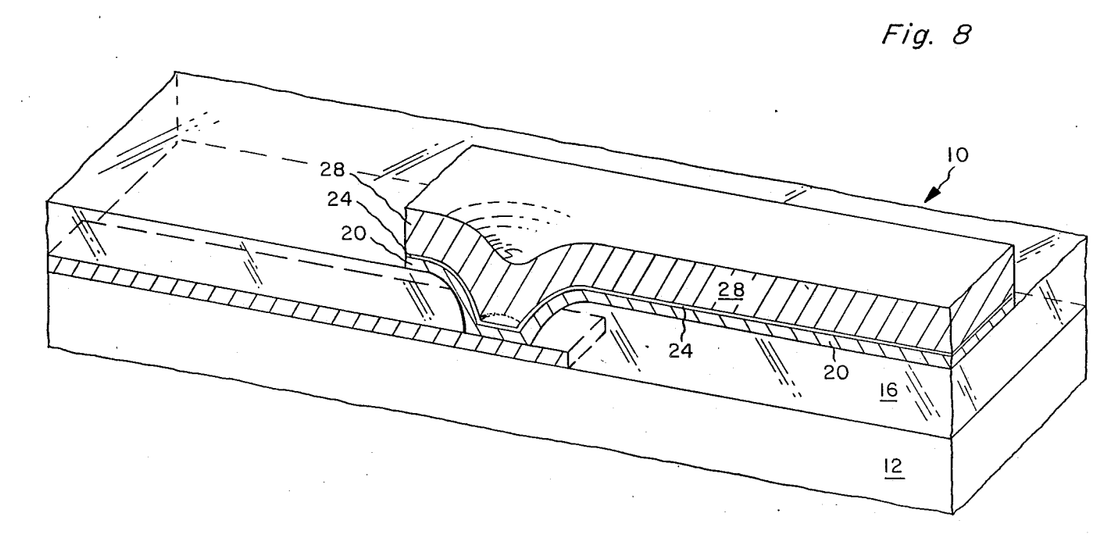

At this or a later stage, as may be appropriate to the particular use intended for the workpiece 10, the portions of the buffer layer 20 which are not covered by the conductor layer 28 are preferably removed by selective etching to leave the electrolessly plated conductor layer as the only conductor pattern on the upper surface of the workpiece 10 as shown in FIG. 8. Where the buffer layer is chromium (Cr) and the conductor layer 28 is copper, the exposed portions of the chromium buffer layer may be removed by a 30 second etch in an etchant such as chromium etchant type TFD, sold by Transene Co., Inc. Where the buffer layer is titanium (Ti) and the conductor layer 28 is copper, the exposed portions of the titanium buffer layer may be removed by a 30 second etch in an etchant such as dilute HF. Those skilled in the art will be able to select appropriate selective etches for other buffer-layer/plated-layer combinations.

During the laser illumination step of the process, the buffer layer 20 masks changes in the properties of the original workpiece surface and, in particular, the differences between the top of the polymer layer 16 and the bottom of the via holes 18 where the underlying conductor line 14 is exposed. That is, the buffer layer makes the surface optical reflectivity and absorptivity the same on top of the polymer layer 16 and at the bottom of the via hole 18. The thermal conductivity on top of the polymer layer 16 and at the bottom of the via hole 18 are made much more similar, but are not necessarily identical because the underlying conductor 14 at the bottom of the via hole can enhance thermal conductivity at that location. This uniformity of characteristics allows the laser power and scan rate to be set at values which are effective both on top of the polymer layer and at the bottom of via holes.

In the absence of the buffer layer 20, substantially more laser power is required to cause decomposition of the catalyst source compound into the catalyst metal 24 at the bottom of the via hole 18 than is required along the top of the polymer layer 16. Under those circumstances, a metallization pattern cannot be directly drawn with a laser without changing the exposure conditions at via holes. That is, the scan rate of the laser must be reduced at via holes in order to assure decomposition of the catalyst source compound at the bottom of the via hole where the underlying metal layer is much more reflective to laser light than is the surface of the polymer layer 16 and where the thermal conductivity is also much higher. As has been discussed, this results in deterioration or destruction of the polymer layer adjacent the via hole. The buffer layer 20 provides all portions of the surface of the substrate with the same reflectivity and absorptivity. The thermal conductivity at the bottom of the via hole may still be slightly greater than on top of the dielectric layer because the underlying conductor 14 can carry heat away faster than the polymer layer 16.

We have found that the present process provides substantially the same catalyst metal density for substrates such as polyimide films, aluminum, silicon and ceramic where a laser wavelength in the vicinity of 266 nm or shorter is used to induce the decomposition of the catalyst source compound. Our work indicates that in the prior art process using a 351 nm laser, the decomposition process is largely a thermal process, since much more energy is required where the conductor 14 is illuminated in order to produce PdAc decomposition than is required where the polymer layer is illuminated. The differences in characteristics of aluminum and the polymer layer substrates at 351 nm are greatly reduced with the buffer layer present. However, they are not completely eliminated. In contrast, with the buffer layer present, there is substantially no difference between the top of the polymer layer 16 and the bottom of the via hole 18 when a laser at 266 nm is used to illuminate the PdAc. Consequently, the decomposition process is thought to be more in the nature of photodecomposition at 266 nm since the difference in thermal conductivities on the top of the polymer layer 16 and at the bottom of the via hole 18 has little or no effect on the process under those conditions. However, in the absence of the buffer layer, substantial differences are present between the top of the polymer layer and the bottom of a via hole even with a 266 nm laser.

Even with the less than ideal characteristics at 351 nm, the present process is a substantial improvement over the use of the prior art process, since there is sufficient uniformity in the vicinity of a via hole that a uniform quality metallization can be formed. This improved process is the result of the more uniform characteristics of the substrate with the buffer layer in place as compared to the situation in the absence of the buffer layer.

A substrate having a surface which in some areas is a Kapton ® polyimide film and in other areas aluminum, was provided with an overlying conductor pattern using the process described above. The aluminum portions of the surface were at the bottom of via holes about 4 mils in diameter. The buffer layer was titanium sputtered to a thickness of about 2,000 angstroms. A PdAc layer approximately 1,000 angstroms thick was formed by spin coating a chloroform solution of PdAc onto the workpiece. This layer was then dried. A frequency quadrupled YAG laser operating at 266 nm was scanned across the substrate surface at a rate of 1 cm/sec. The laser was a pulsed laser operating at 1 KHz and an optical power level of a few mW. The laser spot size was about 50$\mu$ in diameter. The PdAc film was decomposed for a width of 70-100 $\mu$m along the entire laser trace. After electroless copper plating, a uniform width copper conductor about 1 micron thick was formed where the buffer layer was disposed over the Kapton ® polyimide and the aluminum. This establishes the effectiveness of this method of employing a buffer layer to mask the underlying changes in the substrate composition and properties.

While this process has been shown and described in terms of forming the buffer layer over the entire upper surface of the substrate, formation of the buffer layer only on the polymer layer would be sufficient provided the buffer layer and the metal at the bottom of the via holes had sufficiently similar reflectivities and absorptivities.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A process for forming a desired conductor pattern on a patterned surface of a substrate comprising:
   providing said patterned substrate, said substrate including a surface pattern of areas having differing characteristics selected from the group consisting of composition, optical reflectivity, optical absorptivity and thermal conductivity;
   providing a buffer layer on said substrate patterned surface, said buffer layer extending across at least two areas of said surface pattern having differing characteristics;
   laser illuminating said buffer layer in said desired conductor pattern in the presence of a catalyst source compound to form a layer of an electroless plating catalyst on said buffer layer in said desired conductor pattern;
   said formation of said catalyst pattern being by decomposition of said catalyst source compound to provide said catalyst on said buffer layer and where said differing characteristics would affect said decomposition in the absence of said buffer layer; and
   exposing said catalyst patterned buffer layer to an electroless plating environment to deposit electroless metal on said buffer layer in a pattern determined by the pattern of said catalyst.

2. The process recited in claim 1 wherein: said buffer layer comprises a metal.

3. The process recited in claim 1 further comprising, after said exposing step, the step of:
   removing portions of said buffer layer which are not covered by said electroless metal.

4. The process recited in claim 1 further comprising the step:
   depositing said catalyst containing compound on said buffer layer prior to the step of laser illuminating.

5. The process recited in claim 4 further comprising the step of:
   rinsing catalyst source compound from said buffer layer prior to exposing said catalyst patterned buffer layer to said electroless plating environment.

6. The process recited in claim 5 wherein:
   said electroless plating environment comprises an electroless plating bath.

7. The process recited in claim 1 wherein:
   said buffer layer comprises a metal selected from the group consisting of Ti and Cr.

8. The process recited in claim 7 wherein:
   said electroless metal comprises a metal selected from the group consisting of Cu, Au, Ni and Sn.

9. The process recited in claim 1 wherein:
   said electroless metal comprises a metal selected from the group consisting of Cu, Ni, Au and Sn.

10. The process recited in claim 1 wherein:
    said surface pattern of said patterned substrate comprises first areas and second areas, said first areas comprising a polymer and said second areas comprising a metal.

11. The process recited in claim 10 wherein: said polymer is a polyimide.

12. The process recited in claim 11 wherein: said polymer is a polyetherimide.

13. The process recited in claim 10 wherein the polymer is selected from the group consisting of polyimides, polyimide-siloxanes, polyetherimides, polysulfones, epoxys, polycarbonates, polyesters, and polyesterimides.

14. A process for forming a conductor in a desired pattern on a surface of a workpiece which comprises polymer portions and metal portions, said process comprising:
    providing said workpiece having a surface comprised of polymer portions and metal portions, said polymer portions and said metal portions having differing characteristics selected from the group consisting of optical reflectivity, optical absorptivity and thermal conductivity;
    forming a buffer layer on at least said polymer portions of said workpiece surface, to provide said polymer portions and said metal portions of said workpiece surface with substantially similar characteristics;
    laser illuminating said workpiece in said desired pattern in the presence of a catalyst source compound to form a layer of an electroless plating catalyst on said workpiece in said desired pattern by decomposing said catalyst source compound, said pattern including a segment disposed over said polymer portion and a segment disposed over said metal portion;
    exposing said workpiece with said catalyst to an electroless plating environment to deposit electroless metal on said workpiece surface in the pattern of said catalyst.

15. The process recited in claim 14 wherein:
    said forming step comprises forming said buffer layer on said polymer potions of said workpiece surface and on said metal portions of said workpiece surface.

16. The process recited in claim 14 wherein: said polymer is a polyimide.

17. The process recited in claim 16 wherein: said polymer is a polyetherimide.

18. The process recited in claim 14 wherein the polymer is selected from the group consisting of polyimides, polyimide-siloxanes, polysulfones, epoxys, polycarbonates, polyesters, and polyesterimides.

* * * * *